(12) United States Patent
Li

(10) Patent No.: US 12,107,600 B2
(45) Date of Patent: Oct. 1, 2024

(54) WINDOW-INTEGRATED CHARGE-MODE DIGITAL-TO-ANALOG CONVERTER FOR ARBITRARY WAVEFORM GENERATOR

(71) Applicant: Fermi Research Alliance, LLC, Batavia, IL (US)

(72) Inventor: Shaorui Li, East Setauket, NY (US)

(73) Assignee: Fermi Research Alliance, LLC, Batavia, IL (US)

( * ) Notice: Subject to any disclaimer, the term of this patent is extended or adjusted under 35 U.S.C. 154(b) by 511 days.

(21) Appl. No.: 17/409,780

(22) Filed: Aug. 23, 2021

(65) Prior Publication Data

US 2023/0054368 A1     Feb. 23, 2023

(51) Int. Cl.
| | |
|---|---|
| *H03M 1/80* | (2006.01) |
| *G06N 10/00* | (2022.01) |
| *H03M 1/66* | (2006.01) |
| *H03M 1/70* | (2006.01) |

(52) U.S. Cl.
CPC ............ *H03M 1/806* (2013.01); *G06N 10/00* (2019.01); *H03M 1/661* (2013.01); *H03M 1/70* (2013.01)

(58) Field of Classification Search
CPC ........ H03M 1/806; H03M 1/661; H03M 1/70; G06N 10/00
See application file for complete search history.

(56) References Cited

U.S. PATENT DOCUMENTS

| | | | |
|---|---|---|---|
| 4,831,378 A | 5/1989 | Baars et al. | |
| 5,189,423 A | 2/1993 | Linnenbrink et al. | |
| 7,352,314 B2 | 4/2008 | Horibata | |
| 2008/0084342 A1 | 4/2008 | Hong et al. | |
| 2011/0069777 A1 | 3/2011 | Hurwitz et al. | |
| 2011/0074617 A1 | 3/2011 | Portmann et al. | |
| 2011/0148680 A1 | 6/2011 | Kuramochi | |
| 2015/0312501 A1* | 10/2015 | Fahim | H04N 25/79 |
| | | | 348/294 |
| 2016/0292587 A1 | 10/2016 | Rigetti et al. | |
| 2019/0372564 A1* | 12/2019 | Jensen | H03K 3/53 |
| 2020/0077039 A1* | 3/2020 | Zimmerman | H03F 3/345 |

OTHER PUBLICATIONS

International Search Report and Written Opinion received in Patent Cooperation Treaty Application No. PCT/US2022/038982, dated Oct. 28, 2022, 10 pages.

* cited by examiner

*Primary Examiner* — Rafael O De Leon Domenech
(74) *Attorney, Agent, or Firm* — William A. Harding; Grable Martin PLLC

(57) ABSTRACT

A digital-to-analog converter circuit that creates an analog waveform from an input digital waveform. Operating the circuit comprises using the input digital waveform to 1) operate a charge control switch to set a charge time period, 2) operate a discharge control switch to set a discharge time period, 3) set a charge current magnitude using a charge gain, and 4) set a discharge current magnitude using a discharge gain. A charge source electrically charges a load capacitor during the charge time period (i.e., the charge mode). A discharge source electrically discharges the load capacitor during the discharge time period (i.e., the discharge mode). A circuit output transmits the analog waveform defined by the charge mode and the discharge mode. A charge current magnitude greater than the discharge current magnitude produces an upward-sloping analog waveform. A charge current magnitude less than the discharge current magnitude produces a downward-sloping analog waveform.

20 Claims, 10 Drawing Sheets

WINDOW-INTEGRATED CHARGE-MODE DIGITAL-TO-ANALOG CONVERTER FOR ARBITRARY WAVEFORM GENERATOR

STATEMENT REGARDING FEDERALLY SPONSORED RESEARCH OR DEVELOPMENT

The invention described in this patent application was made with Government support under the Fermi Research Alliance, LLC, Contract Number DE-AC02-07CH11359 awarded by the U.S. Department of Energy. The Government has certain rights in the invention.

FIELD OF THE INVENTION

The present invention relates generally to quantum computer control technology. More particularly, this invention pertains to a waveform generator architecture for incorporation into an ion trap controller.

BACKGROUND OF THE INVENTION

Setup of quantum computing experiments typically involves incorporation of systems for quantum bit (qubit) control and readout. Such systems provide rapid control signal generation and injection to qubit gates, and subsequent observation of final state projections. Each qubit is typically addressed individually by a single coaxial cable, and response states are typically read out by charge proximity sensors along similar lengths of cable. Attempts to scale such quantum computer architectures to the order of millions of qubits (and, therefore, millions of wires) have been limited by what is known in the quantum computing field as the "wiring bottleneck." The sheer volume of wiring required for signal injection and state observation is further complicated by the cryogenic temperatures at which qubits operate (typically less than 500 millikelvin (mK)), and by the fact that the electronics to control the qubits typically operate at room temperature (closer to 300 Kelvin (K)). Most conventional integrated circuits simply cannot endure such extreme temperature ranges.

A trapped ion quantum computer is one promising approach to achieving a large-scale quantum computer. In such an architecture, charged atomic particles (ions) are confined and suspended in free space using electromagnetic fields. Qubits are stored in stable electronic states of each ion, and quantum information may be transferred through the collective quantized motion of the ions in a shared trap (interacting through the Coulomb force). Lasers may be applied to induce coupling between the qubit states (for single qubit operations) or coupling between the internal qubit states and the external motional states (for entanglement between qubits). Unfortunately, known solutions for ion trap control are still limited by the employment of expensive and bulky room-operation electronics to send control signals (in the form of analog waveforms) to an ion trap.

In one common ion trap control design, an automated test platform comprising a controller may be used to create a scan list of frequencies which may, in turn, be downloaded to one or more waveform generators. For example, to produce ninety-six (96) channels, one might need to employ twelve (12) waveform generator modules of eight (8) channels each. The waveform generator(s) may process the input scan list to output each defined frequency to be transmitted to an oscilloscope along with a trigger for output as a waveform frequency. This generated waveform frequency may enter a 4 K cryocooler environment to drive control of a microelectromechanical system (MEMS)-scale surface electrode ion trap. Upon taking a measurement at the end of the controlled quantum action, a returned trigger to the waveform generator may prompt processing of the next defined frequency in the scan list. This cycling of triggers into and back from the 4 K cryocooler environment may continue until the scan list on the waveform generator is complete.

Promising areas of research into scaling trapped ion quantum computing to arbitrarily large numbers of qubits include transporting ions to spatially distinct locations in an array of ion traps, building large entangled states via photonically connected networks of remotely entangled ion chains, and combinations of these two ideas. But, to date, experiments have been limited to tens of ion qubits. Efforts to scale such trapped ion quantum computer architectures may benefit from integration of control elements into the ion trap's vacuum chamber to reduce the number of required interconnects. But doing so potentially requires trade-offs among device area, power, speed, and noise. Also, such trade-offs must not unduly compromise waveform peak bandwidth, vertical resolution, and/or maximum amplitude. Accordingly, a need exists for a solution to at least one of the aforementioned challenges in ion trap control design. For instance, an established need exists for improvements in the state of the art for cryogenic control chip design.

This background information is provided to reveal information believed by the applicant to be of possible relevance to the present invention. No admission is necessarily intended, nor should be construed, that any of the preceding information constitutes prior art against the present invention.

SUMMARY OF THE INVENTION

With the above in mind, embodiments of the present invention may comprise a digital-to-analog converter circuit configured to receive an input digital waveform and to create from that input an analog waveform. The input digital waveform is used both by a charging controlled input of the circuit to operate a charge control switch to set a charge time period, and by a discharging controlled input of the circuit to operate a discharge control switch to set a discharge time period. In a charge mode, a charge source electrically charges a load capacitor during the charge time period. In a discharge mode, a discharge source electrically discharges the load capacitor during the discharge time period. The charge source may comprise a charge gain for setting a charge current magnitude, and the discharge source may comprise a discharge gain for setting a discharge current magnitude. The analog waveform, defined at least in part by the charge mode and/or the discharge mode, may be transmitted using a circuit output. The charge time period and the discharge time period may occur simultaneously within an operation window (i.e., a charge integration window). The digital-to-analog converter circuit may comprise a cryogenic Application-Specific Integrated Circuit (ASIC).

The charging controlled input is further configured to create a charging control signal from the input digital waveform and to transmit the charging control signal to operate the charge control switch. When the charging control signal is in an On state, the charge control switch may enable the charge mode. When the charging control signal is in an Off state, the charge control switch may disable the charge mode. Similarly, the discharging controlled input is further configured to create a discharging control signal from the input digital waveform and to transmit the discharging control signal to operate the charge control switch. When the discharging control signal is in an On state, the discharge control switch may enable the discharge mode. When the discharging control signal is in an Off state, the discharge control switch may disable the discharge mode.

In another embodiment of the present invention, a method of operating an analog waveform generation system comprising the digital-to-analog converter circuit may comprise the steps of 1) transmitting an input digital waveform to the digital-to-analog converter circuit, 2) using a charging controlled input to operate a charge control switch to set a charge time period based on the input digital waveform, 3) using a discharging controlled input to operate a discharge control switch to set a discharge time period equal to the charge time period based on the input digital waveform, 4) using a charge gain to operate a charge source to set a charge current magnitude based on the input digital waveform, 5) using a discharge gain to operate a discharge source to set a discharge current magnitude based on the input digital waveform, 6) using the charge source to electrically charge a load capacitor during the charge time period (i.e., charge mode), 7) using the discharge source to electrically discharge the load capacitor during the discharge time period (i.e., discharge mode), and 8) using a circuit output to transmit an analog waveform defined at least in part by the charge mode and the discharge mode. When the charge current magnitude is greater than the discharge current magnitude, the analog waveform produced may comprise an upward-sloping substantially linear segment. When the charge current magnitude is less than the discharge current magnitude, the analog waveform produced may comprise a downward-sloping substantially linear segment.

These and other objects, features, and advantages of the present invention will become more readily apparent from the attached drawings and the detailed description of the preferred embodiments, which follow.

BRIEF DESCRIPTION OF THE DRAWINGS

The preferred embodiments of the invention will hereinafter be described in conjunction with the appended drawings provided to illustrate and not to limit the invention, where like designations denote like elements, and in which.

Like reference numerals refer to like parts throughout the several views of the drawings.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Although the following detailed description contains many specifics for the purposes of illustration, anyone of ordinary skill in the art will appreciate that many variations and alterations to the following details are within the scope of the invention. Accordingly, the following embodiments of the invention are set forth without any loss of generality to, and without imposing limitations upon, the claimed invention.

As used herein, the word "exemplary" or "illustrative" means "serving as an example, instance, or illustration." Any implementation described herein as "exemplary" or "illustrative" is not necessarily to be construed as preferred or advantageous over other implementations. All of the implementations described below are exemplary implementations provided to enable persons skilled in the art to make or use the embodiments of the disclosure and are not intended to limit the scope of the disclosure, which is defined by the claims.

Furthermore, in this detailed description, a person skilled in the art should note that quantitative qualifying terms such as "generally," "substantially," "mostly," and other terms are used, in general, to mean that the referred to object, characteristic, or quality constitutes a majority of the subject of the reference. The meaning of any of these terms is dependent upon the context within which it is used, and the meaning may be expressly modified.

Figure 1:
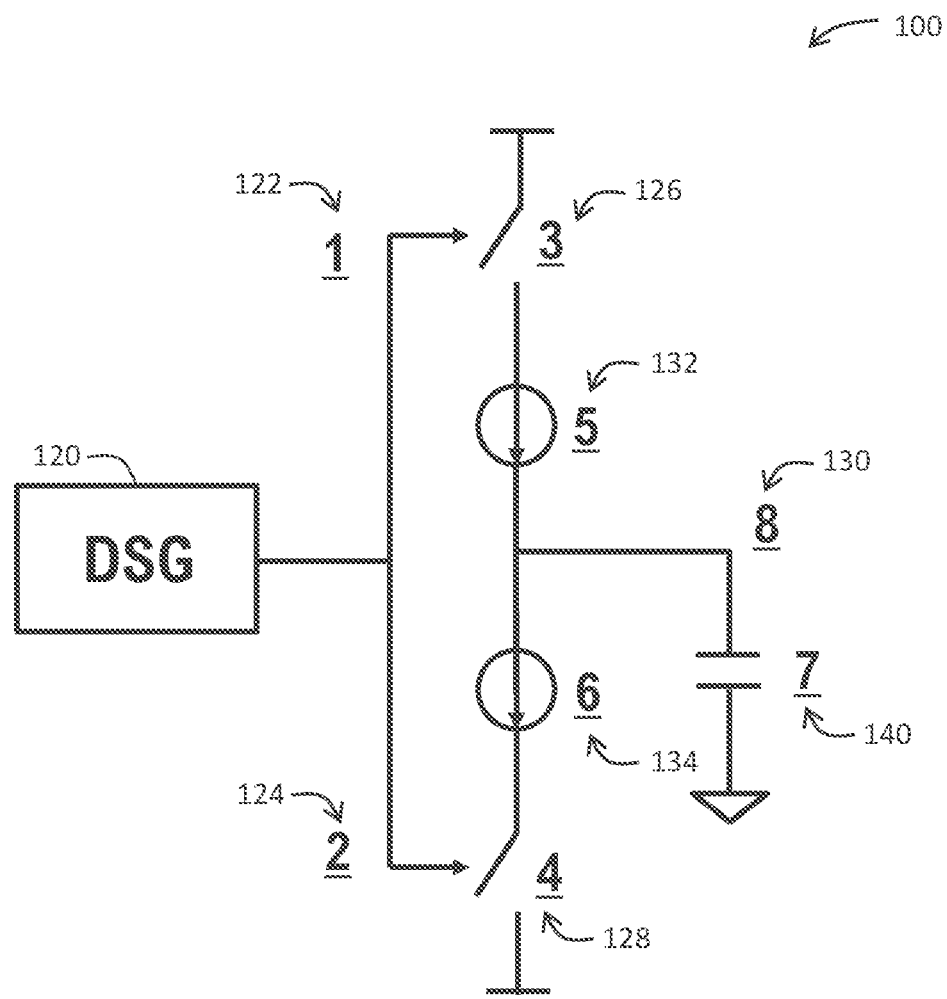
FIG. 1 is a circuit diagram of an exemplary window-integrated charge-mode digital-to-analog converter according to an embodiment of the present invention.
Figure 2A:
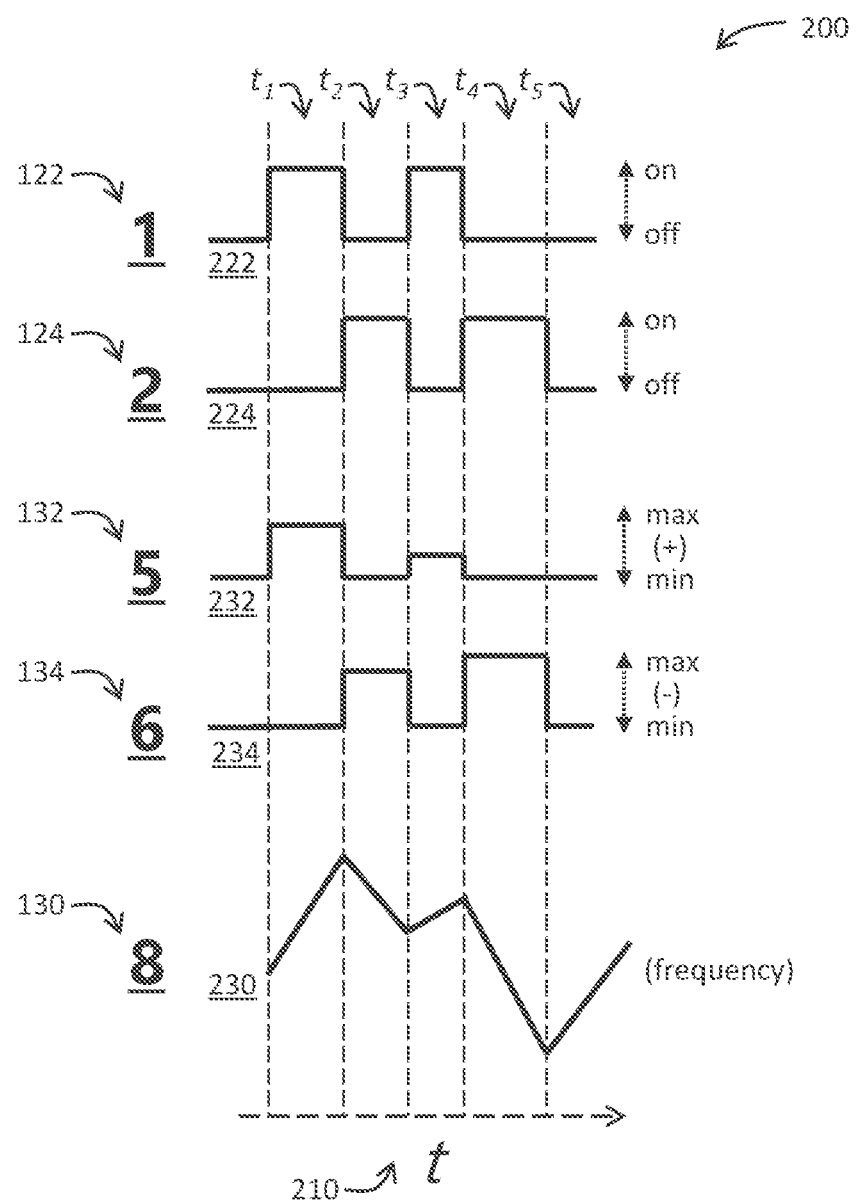
FIG. 2A is a graph of a first exemplary analog waveform of substantially-linear segments as created by the digital-of-analog converter of FIG. 1.
Figure 2B:
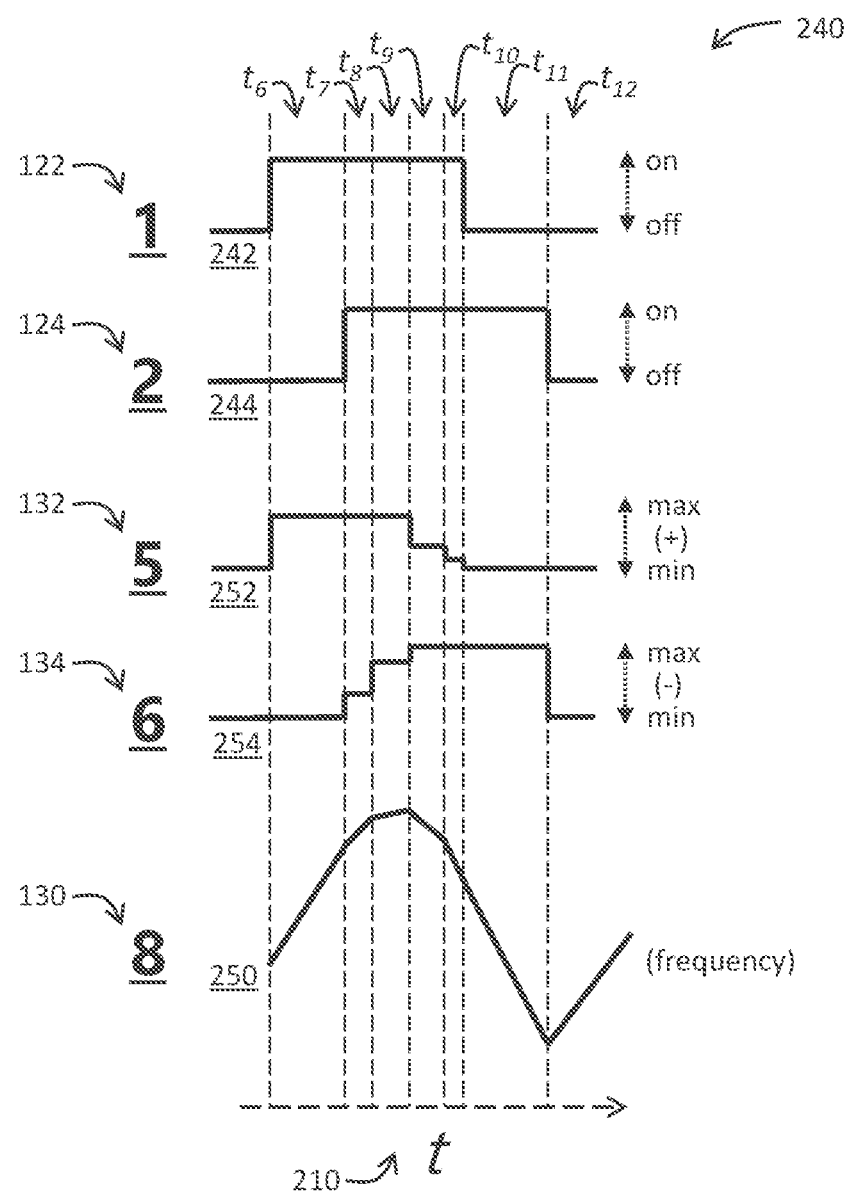
FIG. 2B is a graph of a second exemplary analog waveform of substantially-linear segments as created by the digital-of-analog converter of FIG. 1.
Figure 3:
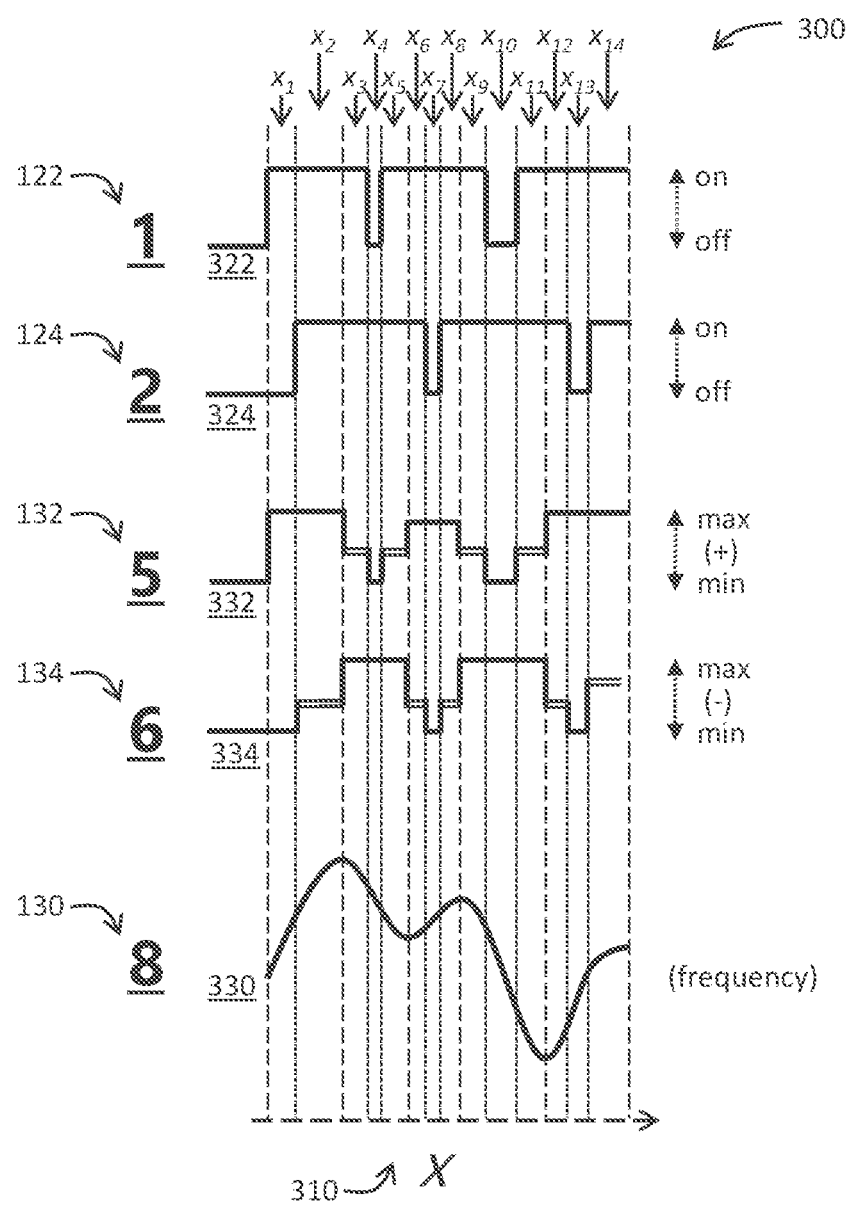
FIGS. 3, 4, 5, 6, 7, and 8 are graphs of respective exemplary analog waveforms of curve series segments as created by the digital-of-analog converter of FIG. 1.
Figure 4:
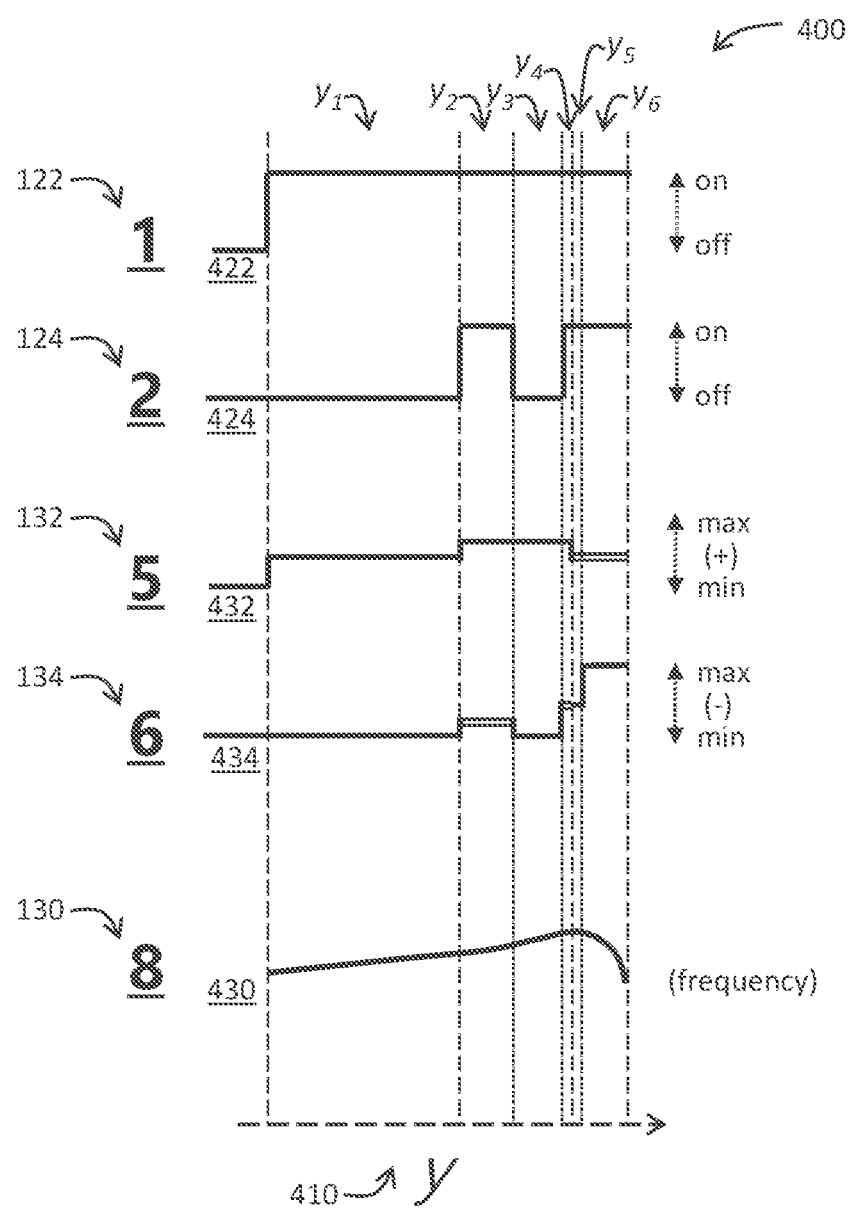
Figure 5:
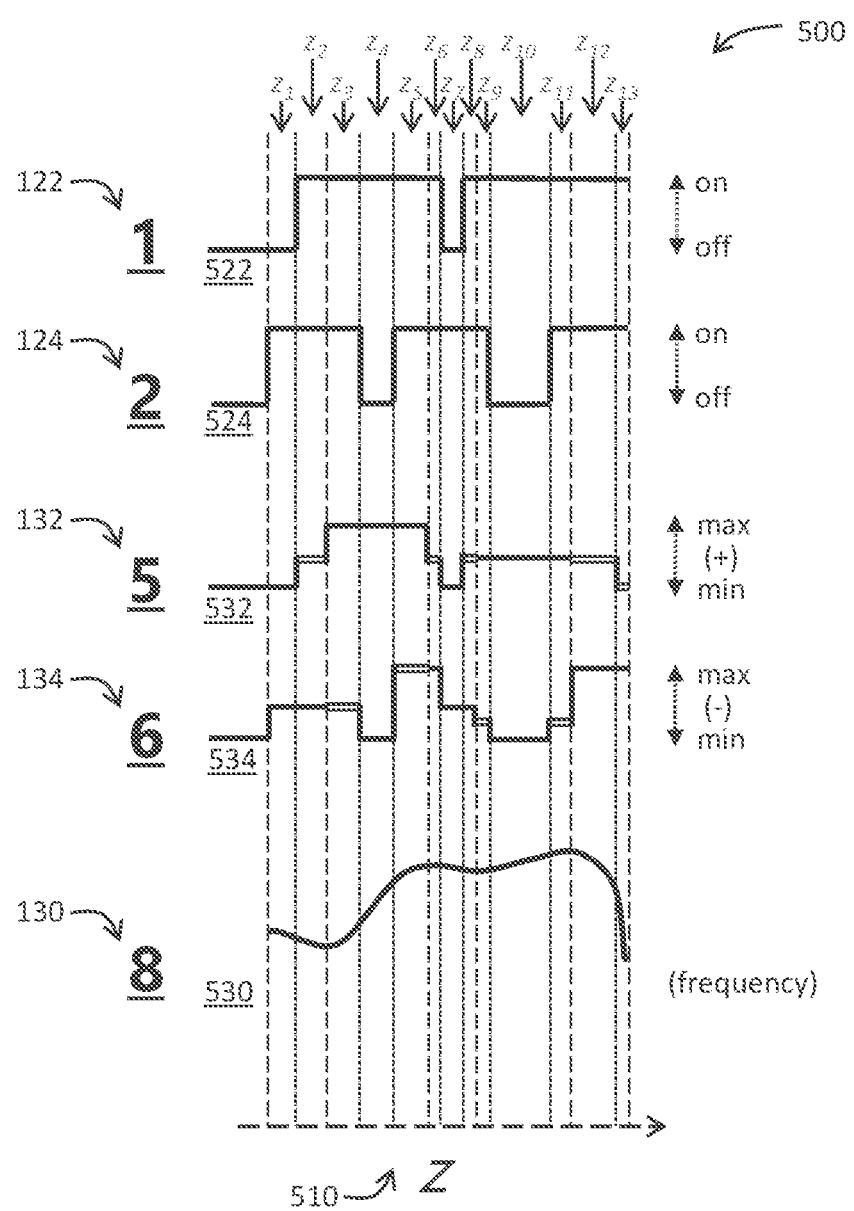
Figure 6:
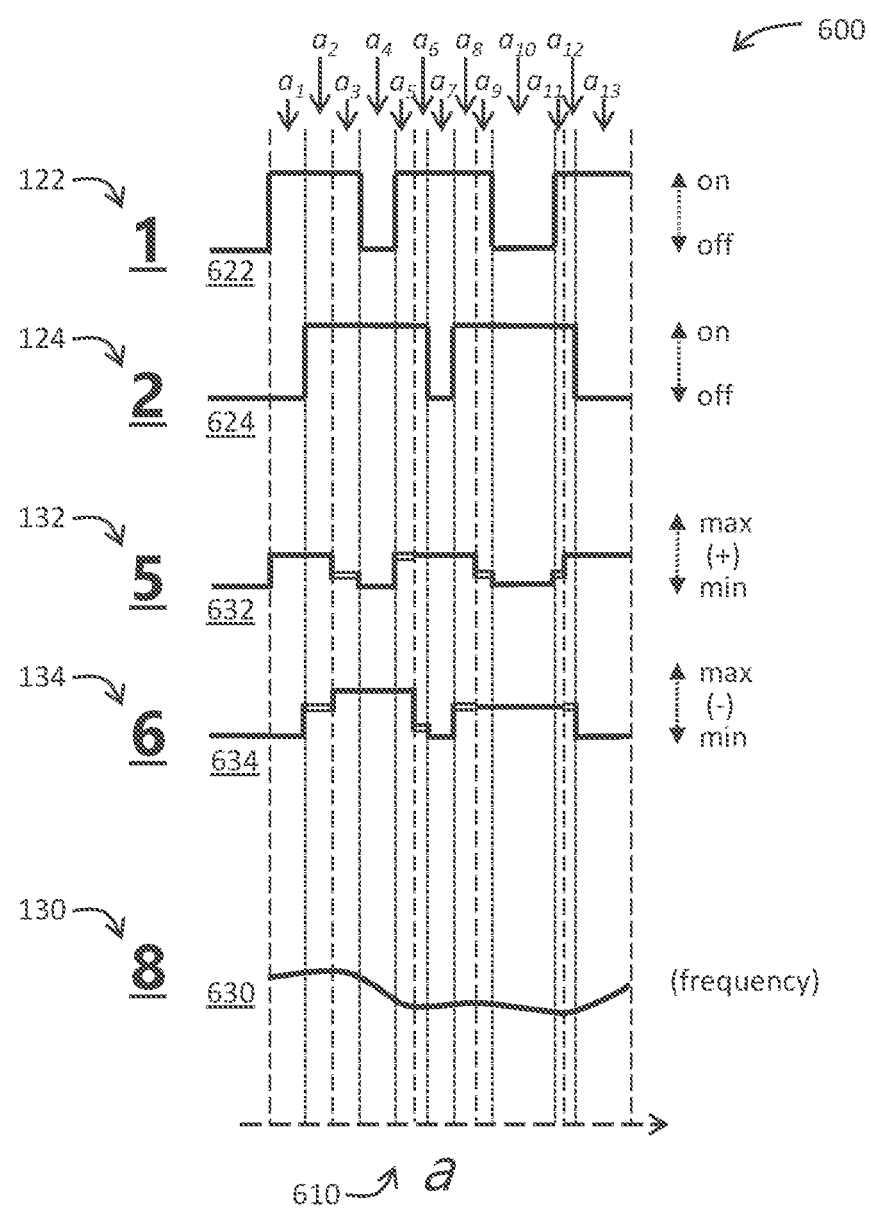
Figure 7:
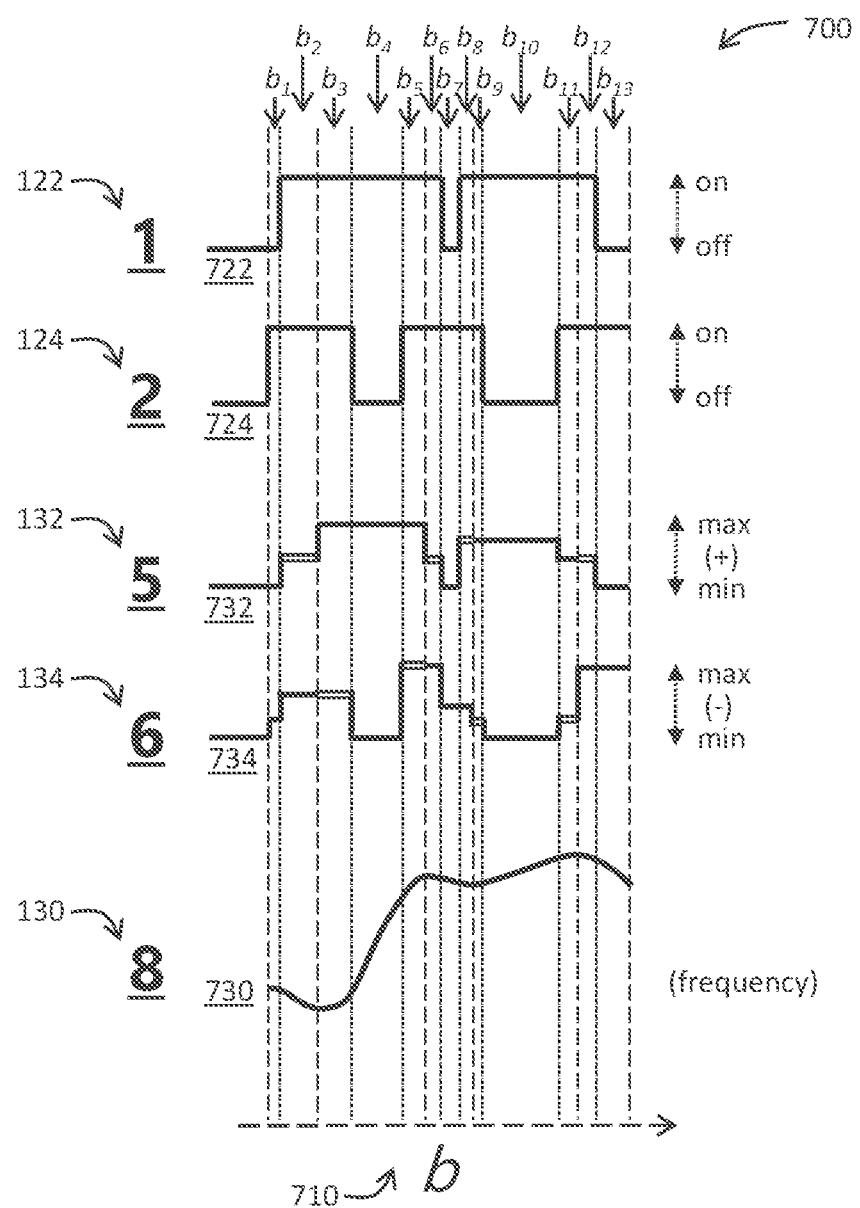
Figure 8:
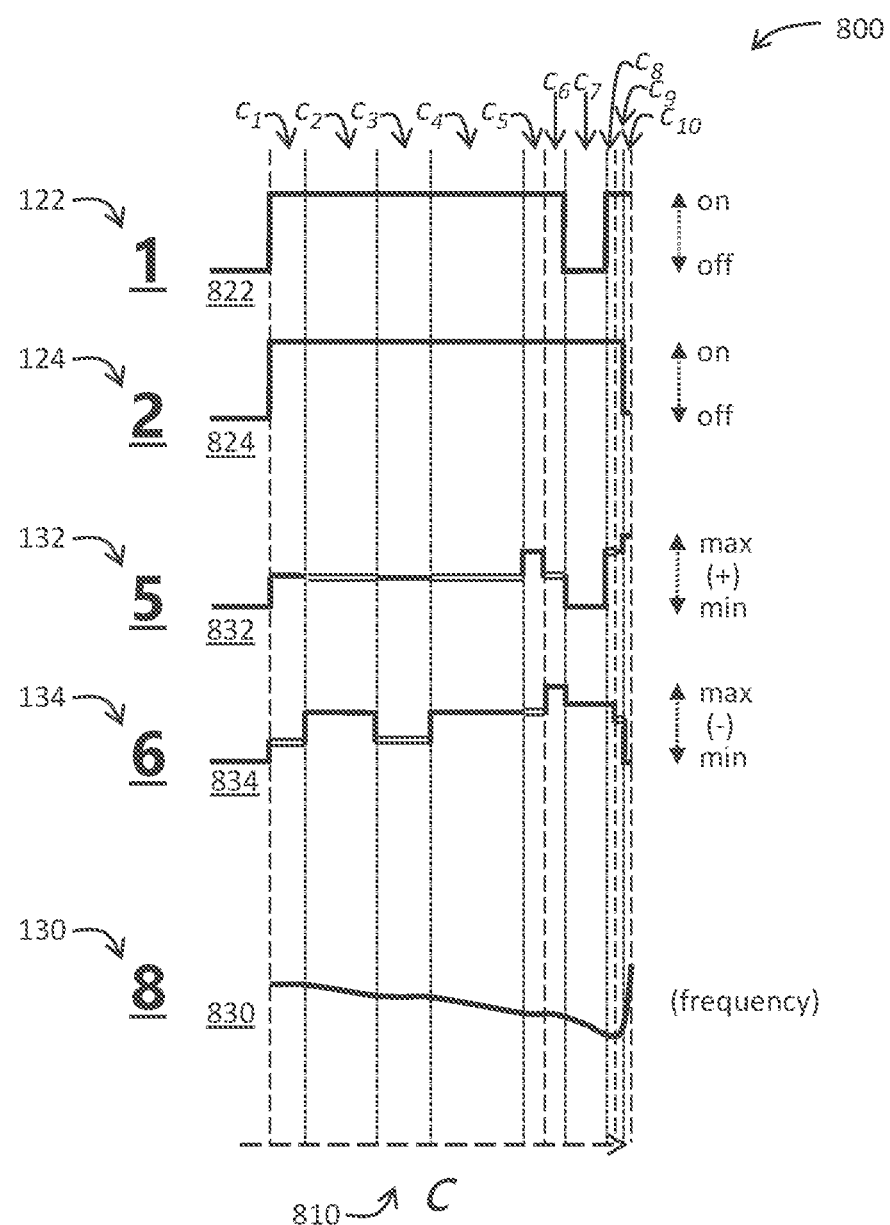

Referring initially to FIGS. 1, 2A, and 2B, a window-integrated charge-mode digital-to-analog converter according to an embodiment of the present invention is now described in detail. Throughout this disclosure, the present invention may be referred to as a digital-to-analog converter (DAC), a window-integrated DAC, a charge-mode DAC, DAC device, a DAC circuit, a DAC chip, an ASIC, a circuit, an assembly, a device, a system, a product, and/or a method. Those skilled in the art will appreciate that this terminology is only illustrative and does not affect the scope of the invention. For instance, the present invention may just as easily relate to integrated circuit implementations characterized by frequency oscillation.

In general, the present invention relates to a window-integrated charge-mode DAC design characterized by advantageously low operating power, small size, high accuracy/resolution, and low noise. In certain embodiments, the present invention may comprise a cryogenic ion trap controller ASIC that may support ninety-six (96) channels all onboard a control chip located inside a 4 K cryocooler environment. Exchanges of triggers (that is, drive control going to a MEMS-scale surface electrode ion trap, and post-measurement returned trigger going to the ASIC) all may take place within the 4 K cryocooler environment.

Referring more specifically to FIGS. 1 and 2A, a circuit topology 100 of a window-integrated charge-mode digital-to-analog converter of the present invention will now be described in detail. As illustrated, certain embodiments of a window-integrated charge-mode digital-to-analog converter 100 may be configured to condition the electrical output of a digital signal generator (DSG) 120 for ultra-low power and low noise delivery of an arbitrary waveform. Digital waveforms may be generated in the DSG 120 and converted at controlled inputs (1) 122 and (2) 124 into charging 222 and discharging 224 control signals, respectively, that may control (e.g., turn On and Off) switches (3) 126 and (4) 128, respectively. When switch (3) 126 is in a charging On state within an operation window t 210, a charge current source (5) 132 may charge a load capacitor (7) 140 for a charge time period enabled by charge control signal 222. For example, and without limitation, charge current source (5) 132 may be a transistor. When switch (4) 128 is in a discharging On state within the operation window t 210, a discharge current source (6) 134 may discharge the load capacitor (7) 140 for a discharge time period enabled by discharge control signal 224. For example, and without limitation, discharge current source (6) 134 may be configured to draw current built up during charging while switch (3) 126 is in the charging On state.

Still referring to FIGS. 1 and 2A, graph 200 shows that an exemplary result from this alternating charge and discharge of the load capacitor (7) 140 is a generated arbitrary waveform as experienced at circuit output position (8) 130. Referring more specifically to FIGS. 2A, 2B, 3, 4, 5, 6, 7, 8, and 9, illustrations of various combinations of controlled inputs (1) 122 and (2) 124 that produce charging and discharging control signals, and that work in cooperation with various combinations of charge current source (5) 132 and discharge current source (6) 134 that deliver charge currents and discharge currents, respectively, during various time periods of a given operation window (each such time period referred to herein as a charge integration window) to produce exemplary analog waveforms, will be described in detail hereinbelow.

For example, and without limitation, FIG. 2A shows that during charge integration windows $t_1$ and $t_3$ within operation window t 210, the controlled input (1) 122 operates switch (3) 126 of FIG. 1 to take on respective charging On states. The charge current source (5) 132 may deliver a charge only during such a charging On state enabled by charge control signal 222. Similarly, FIG. 2A shows that during charge integration windows $t_2$ and $t_4$ within operation window t 210, the controlled input (2) 124 operates switch (4) 128 of FIG. 1 to take on respective discharging On states. The discharge current source (6) 134 may deliver a discharge only during such an On state enabled by discharge control signal 224. FIG. 2A also shows that during charge integration window $t_5$ within operation window t 210, both controlled input (1) 122 and controlled input (2) 124 operate switches (3) 126 and (4) 128 of FIG. 1 to take on respective Off states and, as a result, allow neither the charge current source (5) 132 to deliver a charge control signal 222 nor the discharge current source (6) 134 to deliver a discharge control signal 224.

In certain embodiments, a digital-to-analog converter of the present invention may convert a delivered charge current into a resultant analog waveform segment of substantially linear shape and characterized by a slope and a duration. For example, as illustrated in FIG. 2A, for the respective durations of charge integration windows $t_1$ and $t_3$, charge current source (5) 132 may deliver respective charge currents 232 to be converted to respective upward-sloping substantially linear segments of the analog waveform 230 as experienced at circuit output position (8) 130 of FIG. 1. Because the charge current 232 present during charge integration window $t_1$ approximates a maximum delivery capacity (max (+)) of the charge current source 132, as compared to the charge current 232 present during charge integration window $t_3$ which approximates less than half of the maximum delivery capacity (max (+)), the slope of the analog waveform 230 line segment of charge integration window $t_1$ presents as a steeper upward incline than the slope of the analog waveform 230 line segment of charge integration window $t_3$.

Also for example, as illustrated in FIG. 2A, for the respective durations of charge integration windows $t_2$ and $t_4$, discharge current source (6) 134 may deliver respective discharge currents 234 to be converted to respective downward-sloping substantially linear segments of the analog waveform 230 as experienced at circuit output position (8) 130 of FIG. 1. Because the discharge current 234 present during charge integration window $t_4$ approximates a maximum delivery capacity (max (−)) of the discharge current source 134, as compared to the discharge current 234 present during charge integration window $t_2$ which approximates roughly three-quarters of the maximum delivery capacity (max (−)), the slope of the analog waveform 230 line segment of charge integration window $t_4$ presents as a steeper downward incline than the slope of the analog waveform 230 line segment of charge integration window $t_2$.

Also for example, as illustrated in FIG. 2A, for the duration of charge integration window $t_5$, neither charge current source (5) 132 nor discharge current source (6) 134 may impact ongoing digital-to-analog conversion (as both controlled input (1) 122 and controlled input (2) 124 are in respective Off positions). Consequently, a gradual return to nominal frequency from the current state of charge as experienced at circuit output position (8) 130 of FIG. 1 is illustrated in the rightmost substantially linear segment of the analog waveform 230.

In alternative embodiments, a digital-to-analog converter of the present invention may convert a delivered charge current into a resultant analog waveform segment of substantially curved shape by combining the effects of charge and discharge modes over judiciously controlled charge integration windows. Similar to the operation described for FIG. 2A above, graph 240 of FIG. 2B shows that during charge integration window $t_6$ within operation window t 210, the controlled input (1) 122 operates switch (3) 126 of FIG. 1 to take on a charging On state that allows charge current source (5) 132 to deliver charge current 252 to be converted to an upward-sloping substantially linear segment of the analog waveform 250 as experienced at circuit output position (8) 130 of FIG. 1. Also similar to FIG. 2A operation, graph 240 of FIG. 2B shows that during charge integration window $t_{11}$ within operation window t 210, the controlled input (2) 124 operates switch (4) 128 of FIG. 1 to take on a discharging On state that allows discharge current source (6) 134 to deliver a discharge current 254 to be converted to a downward-sloping substantially linear segment of the analog waveform 250 as experienced at circuit output position (8) 130 of FIG. 1.

However, unlike the distinct charging and discharging within each time window illustrated in FIG. 2A, the operation of integrated charging and discharging actions within a common time window are summarized in graph 240 of FIG. 2B. For example, and without limitation, for the respective durations of charge integration windows $t_7$, $t_8$, $t_9$, and $t_{10}$, while the controlled input (1) 122 operates switch (3) 126 of FIG. 1 to take on charging On states 242 that allow charge current source (5) 132 to deliver charge currents 252, the controlled input (2) 124 simultaneously operates switch (4) 128 of FIG. 1 to take on discharging On states 244 that allow discharge current source (6) 134 to deliver discharge currents 254. The resultant substantially linear segments of the analog waveform 250 as experienced at circuit output position (8) 130 of FIG. 1 during charge integration windows $t_7$, $t_8$, $t_9$, and $t_{10}$ are the summations of the effects of charge currents 252 and discharge currents 254 during each of these charge integration windows.

More specifically, where the charge currents 252 are greater in magnitude than the discharge currents 254 (charge integration windows $t_7$ and $t_8$ in FIG. 2B), resultant upward-sloping substantially linear segments of the analog waveform 250 are experienced at circuit output position (8) 130 of FIG. 1. Where the charge currents 252 are lesser in magnitude than the discharge currents 254 (specifically, charge integration windows $t_9$ and $t_{10}$ in FIG. 2B), resultant downward-sloping substantially linear segments of the analog waveform 250 are experienced at circuit output position (8) 130 of FIG. 1.

The charge current 252 present during charge integration window $t_7$ approximates a maximum delivery capacity (max (+)) of the charge current source (5) 132, as compared to the discharge current 254 also present during common integration window $t_7$ which approximates a third of the maximum delivery capacity (max (−)) of the discharge current source (6) 134. In contrast, the charge current 252 present during charge integration window $t_8$ approximates a maximum delivery capacity (max (+)) of the charge current source 132, as compared to the discharge current 254 also present during common integration window $t_8$ which approximates two-thirds of the maximum delivery capacity (max (−)) of the discharge current source (6) 134. Consequently, the slope of the analog waveform 250 line segment (i.e., formed by the summation of charge current 252 and discharge current 254) of charge integration window $t_7$ presents as a steeper upward incline than the slope of the analog waveform 250 line segment of charge integration window $t_8$.

Continuing, the discharge current 254 present during charge integration window $t_9$ approximates a maximum delivery capacity (max (−)) of the discharge current source 134, as compared to the charge current 252 also present during common integration window $t_9$ which approximates a third of the maximum delivery capacity (max (+)) of the charge current source (5) 132. The discharge current 254 present during charge integration window $t_{10}$ approximates a maximum delivery capacity (max (−)) of the discharge current source 134, as compared to the charge current 252 also present during common integration window $t_{10}$ which approximates one-quarter of the maximum delivery capacity (max (+)) of the charge current source (5) 132. Consequently, the slope of the analog waveform 250 line segment (i.e., formed by the summation of charge current 252 and discharge current 254) of charge integration window $t_{10}$ presents as a steeper downward incline than the slope of the analog waveform 230 line segment of charge integration window $t_9$.

Similar to the phenomenon illustrated in FIG. 2A, for the duration of charge integration window $t_{12}$, neither charge current source (5) 132 nor discharge current source (6) 134 may impact ongoing digital-to-analog conversion (as both controlled input (1) 122 and controlled input (2) 124 are in respective Off positions). Consequently, a gradual return to nominal frequency from the current state of charge as experienced at circuit output position (8) 130 of FIG. 1 is illustrated in the rightmost substantially linear segment of the analog waveform 250.

From the example time periods of charge integration windows $t_7$, $t_8$, $t_9$, and $t_{10}$ illustrated in graph 240 of FIG. 2B, the shorter the operative time durations are selected to be for carefully tuned charge/discharge magnitudes, the more a resultant analog waveform may be shaped to approximate a smooth curve. Generally speaking, a curve may be approximated in an analog waveform over a range of short charge integration windows (such a range hereinafter referred to as a curve series) by employing the controlled inputs (1) 122 and (2) 124 to turn On delivery of currents from both charge current source (5) 132 and discharge current source (6) 134. An upward curve may be produced by summing (i.e., integrating) a charge current of up to maximum delivery capacity (max (+)) of the charge current source (5) 132 with a series of short-duration discharge currents from the discharge current source (6) 134 of less than the present charge delivered from the charge current source (5) 132. Conversely, a downward curve may be produced by summing a discharge current of up to maximum delivery capacity (max (−)) of the discharge current source (6) 134 with a series of short-duration charge currents from the charge current source (5) 132 of less than the of the present discharge delivered from the discharge current source (6) 134. As a matter of convention, a curve series may be depicted graphically hereinafter as a double horizontal line representing an approximate average of the magnitudes of a range of shaping currents over a given duration determined by summing the respective durations of each shaping current in the range (see, for example, and without limitation, graph 300 of FIG. 3 which shows analog waveform 330 upward curved segments demonstrated in charge integration windows $x_2$, $x_6$, $x_8$, $x_{12}$, and $x_{14}$ of operation window 310 and also analog waveform 330 downward curved segments demonstrated in charge integration windows $x_3$, $x_5$, $x_9$, and $x_{11}$ of operation window 310).

Using curve series notation as defined above, FIGS. 4, 5, 6, 7, and 8 illustrate use of a digital-to-analog converter of the present invention to convert certain delivered charge currents into various analog waveforms 430, 530, 630, 730, 830 that may be advantageously applied to control of an ion trap quantum computer, as follows:

Example creations of substantially straight analog waveform line segments of slight upward slope and long duration are illustrated at charge integration windows $y_1$ and $y_3$ of operation window 430; $z_{10}$ of operation window 530; $a_1$ of operation window 630; and $b_{10}$ of operation window 730.

Example creations of substantially curved analog waveform line segments of slight upward arc and long duration are illustrated at charge integration windows $y_2$ of operation window 430; $z_3$, $z_5$, and $z_{11}$ of operation window 530; $a_2$ and $a_{13}$ of operation window 630; $b_3$, $b_5$, and $b_{11}$ of operation window 730; and $c_1$, $c_3$, and $c_5$ of operation window 830.

Example creations of substantially curved analog waveform line segments of slight upward arc and short duration are illustrated at charge integration windows $y_4$ of operation window 430; $z_9$ of operation window 530; $a_6$, $a_8$, and $a_{12}$ of operation window 630; $b_9$ of operation window 730; and $c_9$ of operation window 830.

Example creations of substantially curved analog waveform line segments of slight downward arc and short duration are illustrated at charge integration windows $y_5$ of operation window 430; $z_6$ and $z_8$ of operation window 530; $a_5$, $a_9$, and $a_{11}$ of operation window 630; $b_6$ and $b_8$ of operation window 730; and $c_8$ of operation window 830.

Example creations of substantially curved analog waveform line segments of steep downward arc and long duration are illustrated at charge integration windows $y_6$ of operation window 430; and $z_{12}$ of operation window 530.

Example creations of substantially straight analog waveform line segments of slight downward slope and long duration are illustrated at charge integration windows $z_1$ and $z_7$ of operation window 530; and $a_{10}$ of operation window 630.

Example creations of substantially curved analog waveform line segments of slight downward arc and long duration are illustrated at charge integration windows $z_2$ of operation window 530; $a_3$ of operation window 630; $b_2$ and $b_{12}$ of operation window 730; and $c_2$, $c_4$, and $c_6$ of operation window 830.

Example creations of substantially straight analog waveform line segments of steep upward slope and long duration are illustrated at charge integration windows $z_4$ of operation window 530; and $b_4$ of operation window 730.

Example creations of substantially curved analog waveform line segments of steep downward arc and short duration are illustrated at charge integration windows $z_{13}$ of operation window 530.

Example creations of substantially straight analog waveform line segments of steep downward slope and long duration are illustrated at charge integration windows $a_4$ of operation window 630; $b_{13}$ of operation window 730; and $c_7$ of operation window 830.

Example creations of substantially straight analog waveform line segments of slight upward slope and short duration are illustrated at charge integration windows $a_7$ of operation window 630.

Example creations of substantially straight analog waveform line segments of slight downward slope and short duration are illustrated at charge integration windows $b_1$ and $b_7$ of operation window 730.

Example creations of substantially straight analog waveform line segments of steep upward slope and short duration are illustrated at charge integration window $c_{10}$ of operation window 830.

Figure 9:
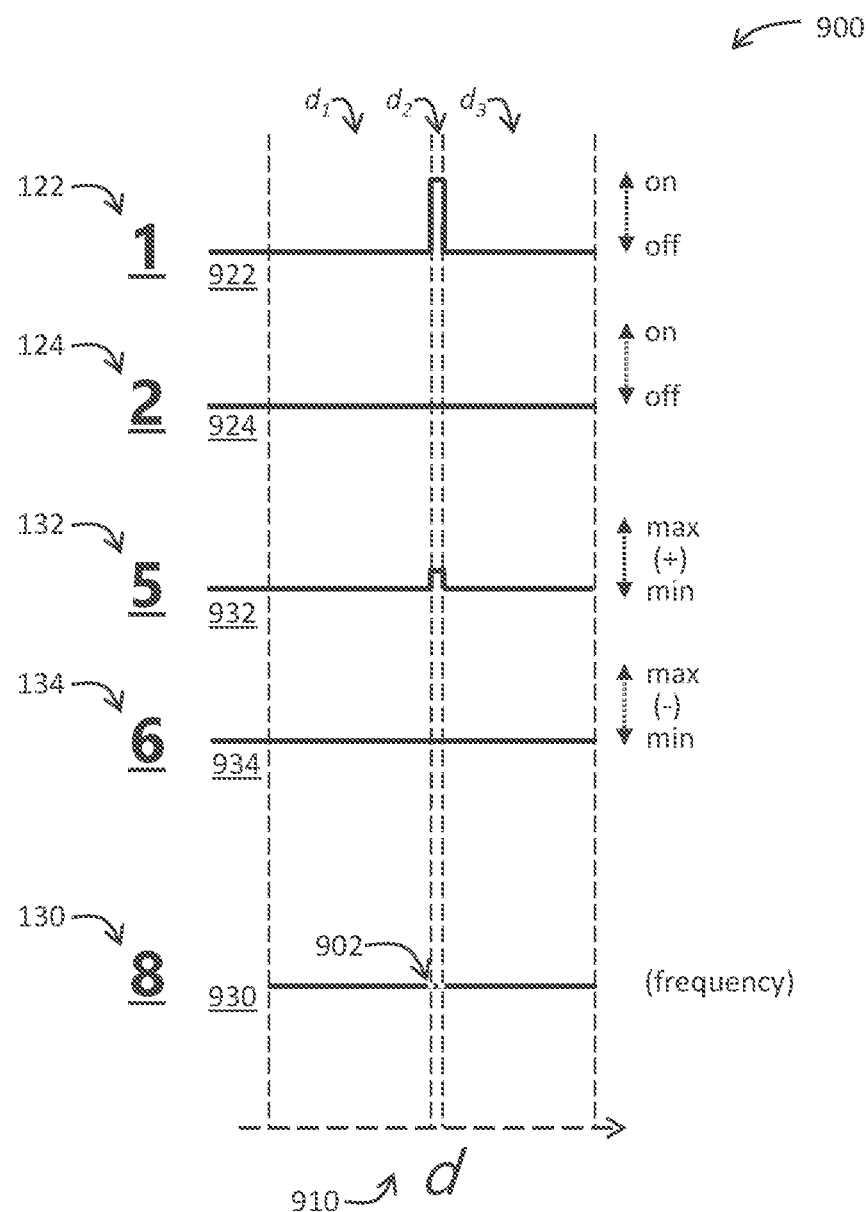
FIG. 9 is graph of an exemplary analog waveform of an augmented substantially-linear segment as created by the digital-to-analog converter of FIG. 1.

Referring now to FIG. 9, graph 900 illustrates use of a digital-to-analog converter of the present invention to deliver an augmenting charge current to maintain a special case analog waveform 930 that may be advantageously applied to control of an ion trap quantum computer. For example, and without limitation, a nominal frequency 930 may be created by turning Off both control signals (1) 122 and (2) 124, thus preventing any current values of current sources (5) 132 and (6) 134 to alter that analog waveform 930. However, upon detection of an anomaly 902 in that nominal frequency 930 (e.g., due to equipment-induced error), a substantially straight analog waveform line segment of slight upward slope and short duration may be introduced at charge integration window $d_2$ of operation window 910 to counteract that error and maintain the desired nominal frequency 930. For example, and without limitation, a feedback loop may be employed to adjust integration window and/or current source.

Advantageously, as described above, the window-integrated charge-mode digital-to-analog converter 100 of the present invention may achieve resolution that is very high by varying the charging and discharging time durations (i.e., charge integration windows) defined by control signals (1) 122 and (2) 124, and/or by varying the summed current values of current sources (5) 132 and (6) 134. Also advantageously, noise may be kept very low by the converter 100 design of the present invention, as the only significant contributors of noise are current sources (5) 132 and (6) 134. Also advantageously, power consumption may be kept very low by the converter 100 design of the present invention, as minimal charging and discharging power is required to generate the desired analog waveform. Accuracy of the generated analog waveform may be calibrated by introducing a calibration scheme to the converter 100 design of the present invention.

Some of the illustrative aspects of the present invention may be advantageous in solving the problems herein described and other problems not discussed which are discoverable by a skilled artisan.

While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

Thus, the scope of the invention should be determined by the appended claims and their legal equivalents, and not by the examples given.

What is claimed is:

1. A digital-to-analog converter circuit comprising:
 a charging controlled input configured to operate, using an input digital waveform, a charge control switch to set a charge time period;
 a discharging controlled input configured to operate, using the input digital waveform, a discharge control switch to set a discharge time period;
 a charge source configured to electrically charge a load capacitor during the charge time period, to define a charge mode;
 a discharge source configured to electrically discharge the load capacitor during the discharge time period, to define a discharge mode; and
 a circuit output configured to transmit an analog waveform defined at least in part by the charge mode and the discharge mode;
 wherein the digital-to-analog converter circuit is of a cryogenic Application-Specific Integrated Circuit (ASIC) type.

2. The digital-to-analog converter circuit according to claim 1, wherein the charge time period and the discharge time period are simultaneous within an operation window, to define a charge integration window.

3. The digital-to-analog converter circuit according to claim 1, wherein the charging controlled input is further configured to create a charging control signal from the input digital waveform and to transmit the charging control signal to operate the charge control switch.

4. The digital-to-analog converter circuit according to claim 3, wherein the charging control signal is characterized by an On state to operate the charge control switch to enable the charge mode.

5. The digital-to-analog converter circuit according to claim 3, wherein the charging control signal is characterized by an Off state to operate the charge control switch to disable the charge mode.

6. The digital-to-analog converter circuit according to claim 1, wherein the discharging controlled input is further configured create a discharging control signal from the input digital waveform and to transmit the discharging control signal to operate the charge control switch.

7. The digital-to-analog converter circuit according to claim 6, wherein the discharging control signal is characterized by an On state to operate the discharge control switch to enable the discharge mode.

8. The digital-to-analog converter circuit according to claim 6, wherein the discharging control signal is characterized by an Off state to operate the discharge control switch to disable the discharge mode.

9. A method of operating a digital-to-analog converter circuit of a cryogenic Application-Specific Integrated Circuit (ASIC) type and comprising a charging controlled input, a charge control switch, a discharging controlled input, a discharge control switch, a charge source, a discharge source, and a load capacitor; the method comprising:
  receiving, using the charging controlled input and the discharging controlled input, an input digital waveform;
  operating, using the charging controlled input, the charge control switch to set a charge time period based on the input digital waveform;
  operating, using the discharging controlled input, the discharge control switch to set a discharge time period based on the input digital waveform;
  electrically charging, using the charge source, the load capacitor during the charge time period, to define a charge mode;
  electrically discharging, using the discharge source, the load capacitor during the discharge time period, to define a discharge mode; and
  transmitting, using the circuit output, an analog waveform defined at least in part by the charge mode and the discharge mode.

10. The method according to claim 9, wherein the charge time period and the discharge time period are simultaneous within an operation window, to define a charge integration window.

11. The method according to claim 9, further comprising creating, using the charging controlled input, a charging control signal from the input digital waveform; and transmitting, using the charging controlled input, the charging control signal to the charge control switch.

12. The method according to claim 11, further comprising operating, using the charging control signal characterized by an On state, the charge control switch to enable the charge mode.

13. The method according to claim 11, further comprising operating, using the charging control signal characterized by an Off state, the charge control switch to disable the charge mode.

14. The method according to claim 9, further comprising creating, using the discharging controlled input, a discharging control signal from the input digital waveform; and transmitting, using the discharging controlled input, the discharging control signal to the charge control switch.

15. The method according to claim 14, further comprising operating, using the discharging control signal characterized by an On state, the discharge control switch to enable the discharge mode.

16. The method according to claim 14, further comprising operating, using the discharging control signal characterized by an Off state, the discharge control switch to disable the discharge mode.

17. A method of operating an analog waveform generation system having a digital-to-analog converter circuit comprising a charging controlled input, a charge control switch, a discharging controlled input, a discharge control switch, a charge source having a charge gain, a discharge source having a discharge gain, and a load capacitor; the method comprising:
  transmitting an input digital waveform to the digital-to-analog converter circuit;
  operating, using the charging controlled input, the charge control switch to set a charge time period based on the input digital waveform;
  operating, using the discharging controlled input, the discharge control switch to set a discharge time period equal to the charge time period based on the input digital waveform;
  operating, using the charge gain, the charge source to set a charge current magnitude based on the input digital waveform;
  operating, using the discharge gain, the discharge source to set a discharge current magnitude based on the input digital waveform;
  electrically charging, using the charge source, the load capacitor during the charge time period, to define a charge mode;
  electrically discharging, using the discharge source, the load capacitor during the discharge time period, to define a discharge mode; and
  transmitting, using the circuit output, an analog waveform defined at least in part by the charge mode and the discharge mode.

18. The method according to claim 17, wherein the charge current magnitude is greater than the discharge current magnitude and the analog waveform is characterized by an upward-sloping substantially linear segment.

19. The method according to claim 17, wherein the charge current magnitude is less than the discharge current magnitude and the analog waveform is characterized by a downward-sloping substantially linear segment.

20. The method according to claim 17, wherein the digital-to-analog converter circuit further comprises a cryogenic Application-Specific Integrated Circuit (ASIC).

* * * * *